United States Patent [19]

Shikakura et al.

[11] Patent Number: 5,212,695

[45] Date of Patent: May 18, 1993

[54] ERROR CHECK OR ERRO CORRECTION CODE CODING DEVICE

[75] Inventors: Akihiro Shikakura, Kawasaki; Tetsuya Shimizu, Yokohama; Motokazu Kashida, Musashino, all of Japan

[73] Assignee: Canon Kabushiki Kaisha, Tokyo, Japan

[21] Appl. No.: 514,303

[22] Filed: Apr. 25, 1990

[30] Foreign Application Priority Data

Apr. 28, 1989 [JP] Japan .................................. 1-109502
Apr. 28, 1989 [JP] Japan .................................. 1-109505
Apr. 28, 1989 [JP] Japan .................................. 1-109513

[51] Int. Cl.$^5$ ............................................. G06F 11/08
[52] U.S. Cl. ...................................... 371/37.1; 371/30
[58] Field of Search ................. 371/37.1, 30, 57.1, 371/11.1

[56] References Cited

U.S. PATENT DOCUMENTS 4,779,276 10/1989 Kashide et al. .
4,875,222 10/1989 Kashida et al. ...................... 375/26
4,958,246 9/1990 Kozuki et al. ............... 360/77.14 X
5,063,453 11/1991 Yoshimura et al. ................ 360/8 X

FOREIGN PATENT DOCUMENTS 194888 3/1986 European Pat. Off. .
3707152 3/1987 Fed. Rep. of Germany .
8603634 6/1986 PCT Int'l Appl. .
8500714 2/1985 World Int. Prop. O. .

Primary Examiner—Charles E. Atkinson
Assistant Examiner—Allen M. Lo
Attorney, Agent, or Firm—Fitzpatrick, Cella, Harper & Scinto

[57] ABSTRACT

An error check or correction code coding device is disclosed. In this device, when a main information code is transmitted after an error check or correction code is added thereto, a control code is included in a code group used in calculations upon generation of the error check or correction code, and a bit pattern of the control code is selected to remove a DC component of the bit pattern of the error check or correction code.

26 Claims, 7 Drawing Sheets

FIG. 1 PRIOR ART

| SYNCHRO-NIZING SIGNAL | INFORMATION DATA | PARITY |
|---|---|---|

FIG. 2 PRIOR ART

| SYNCHRO-NIZING SIGNAL | INFORMATION DATA | INNER CODE PARITY |
|---|---|---|
| ⋮ | ⋮ | ⋮ |
| SYNCHRO-NIZING SIGNAL | INFORMATION DATA | INNER CODE PARITY |
| SYNCHRO-NIZING SIGNAL | OUTER CODE PARITY | INNER CODE PARITY |

ERROR CHECK OR ERRO CORRECTION CODE CODING DEVICE

BACKGROUND OF THE INVENTION

1. Field of the Invention

The present invention relates to an error check or error correction code coding device and, more particularly, to suppression of a low-frequency component of a code string including an error check or error correction code.

2. Description of the Related Background Art

In general, in a system for converting an information signal such as an image signal into a digital signal, and transmitting the digital signal onto a transmission path of, e.g., a recording medium, information data is converted to a transmission code suitable for the transmission path, and the transmission code is transmitted.

In this specification, a magnetic recording apparatus such as a digital VTR will be exemplified as a typical transmission apparatus.

In a magnetic recording apparatus of this type, it is difficult to record/reproduce low-frequency or DC components due to transmission characteristics of a magnetic recording system. For this reason, in general, digital data to be recorded is converted to a recording code including less low-frequency components, and recording is then performed.

As a conversion coding system for suppressing low-frequency components, a conversion coding system having redundancy such as a system for converting 8-bit data into 9-bit data (8-9 conversion) is normally employed. With this system, however, redundancy is undesirably increased. Along with an increase in data volume and an increase in recording density, a demand has arisen for a coding system which is free from an increase in redundancy in consideration of a requirement for recording/reproduction with a smaller number of codes.

As a system free from an increase in redundancy, for example, an n-n mapping coding system for converting n-bit data to n-bit data is proposed. The n-n mapping coding suppresses low-frequency components of a code string to be recorded by utilizing a statistical nature of an input code string, e.g., for image information, the which correlation between adjacent codes.

As an example of this system, by utilizing the fact that input signals are converted to differential codes and the differential codes are concentrated near zero of positive/negative quantization level, i.e., define a Laplace distribution, a code having a small CDS (Code word Digital Sum) is assigned to a differential code having a high frequency of appearance, thereby decreasing a DSV (Digital Sum Value) of a mapping-coded code string after conversion. In this manner, low-frequency components of a code string to be coded are suppressed. For example, a 4-4 mapping coding system for converting a 4-bit differential code into a 4-bit code is known.

The mapping coding can suppress low-frequency components of a coded code string for an information code such as image information having a correlation between adjacent codes, as described above. However, the mapping coding cannot suppress low-frequency components of codes having no such correlation.

For example, when an error check or correction code for checking or correcting a code error or additional information having no correlation is added or substituted in a code string to be recorded, sufficient suppression of low-frequency components cannot be obtained for the code string. As the result, a code error rate upon decoding may be undesirably increased.

This respect will be further described below with reference to FIG. 1. FIG. 1 is a view showing a format of a typical data frame as a format of a code string to be recorded. In FIG. 1, an information code string subjected to mapping coding described above is stored in a portion shown as "information data", and a check digit of an error check or correction code, e.g., a Hamming code, or Reed-Solomon code is stored in a portion shown as "parity". Furthermore, an additional information code such as a synchronizing code or an ID code is stored in a portion shown as "synchronizing signal".

When the data frame is constituted, as shown in FIG. 1, a portion in which check digits of an error check or correction code successively appear has no correlation, and cannot be subjected to mapping coding. Thus, the same codes tend to continuously appear. Therefore, low-frequency components tend to be generated in this portion, and cannot be sufficiently suppressed in the entire code string to be recorded.

FIG. 2 shows a data matrix in which an inner code (row check code) is formed in the data frame shown in FIG. 1, and a plurality of data frames are vertically arranged to form an outer code (column check code), so that a product code is formed as a whole. In this format, in particular, since main information codes and parities are two-dimensionally arranged, this code format is suitable for an apparatus for recording a code string obtained by coding two-dimensional information such as image data. The data matrix is sequentially recorded in units of data frames.

When the data matrix shown in FIG. 2 is formed, suppression of low-frequency components by mapping coding cannot be expected since the inner and outer codes have no correlation therebetween, and the same codes tend to continuously appear. In particular, in a data frame constituted by parities of codes and inner codes, the parities continuously appear for a long period of time, and low-frequency component suppression in code strings near this code frame is considerably impaired.

As a method of solving such a problem, the assignee of the present invention proposed a technique for scattering additional information codes such as error check or correction codes in a code string to be recorded (see U.S. Pat. No. 4,779,276).

In this technique, since codes which cause generation of low-frequency components are scattered in a code string, the code error rate in decoding can be greatly reduced. In this technique, low-frequency components of error check or correction codes themselves are left unchanged.

SUMMARY OF THE INVENTION

The present invention has been made in consideration of the above situation, and has as its object to provide a new coding device which suppresses low-frequency components of error check or correction codes themselves to suppress low-frequency components of the entire code string.

In order to achieve the above object, according to one aspect of the present invention, there is provided an error check or error correction code coding device comprising:

(a) means for calculating a redundancy code for detecting or correcting an error using a code group including main information codes and a control code having no correlation with the main information codes; and (b) selection means for selecting a pattern of the control code from a plurality of patterns, the selection means selecting a pattern which can reduce a DC component of the redundancy code as much as possible.

With the above arrangement, when a bit pattern of control codes is appropriately selected, low-frequency components of error check or correction codes can be effectively suppressed.

The above and other objects and features of the present invention will become apparent from the following description of the preferred embodiments of the present invention.

BRIEF DESCRIPTION OF THE DRAWINGS

FIG. 1 shows a format of a conventional data frame;

FIG. 2 shows a format of a data matrix when a product code is formed by utilizing the data frame shown in FIG. 1;

DETAILED DESCRIPTION OF THE PREFERRED EMBODIMENTS

An embodiment of the present invention will be described hereinafter.

Figure 3:
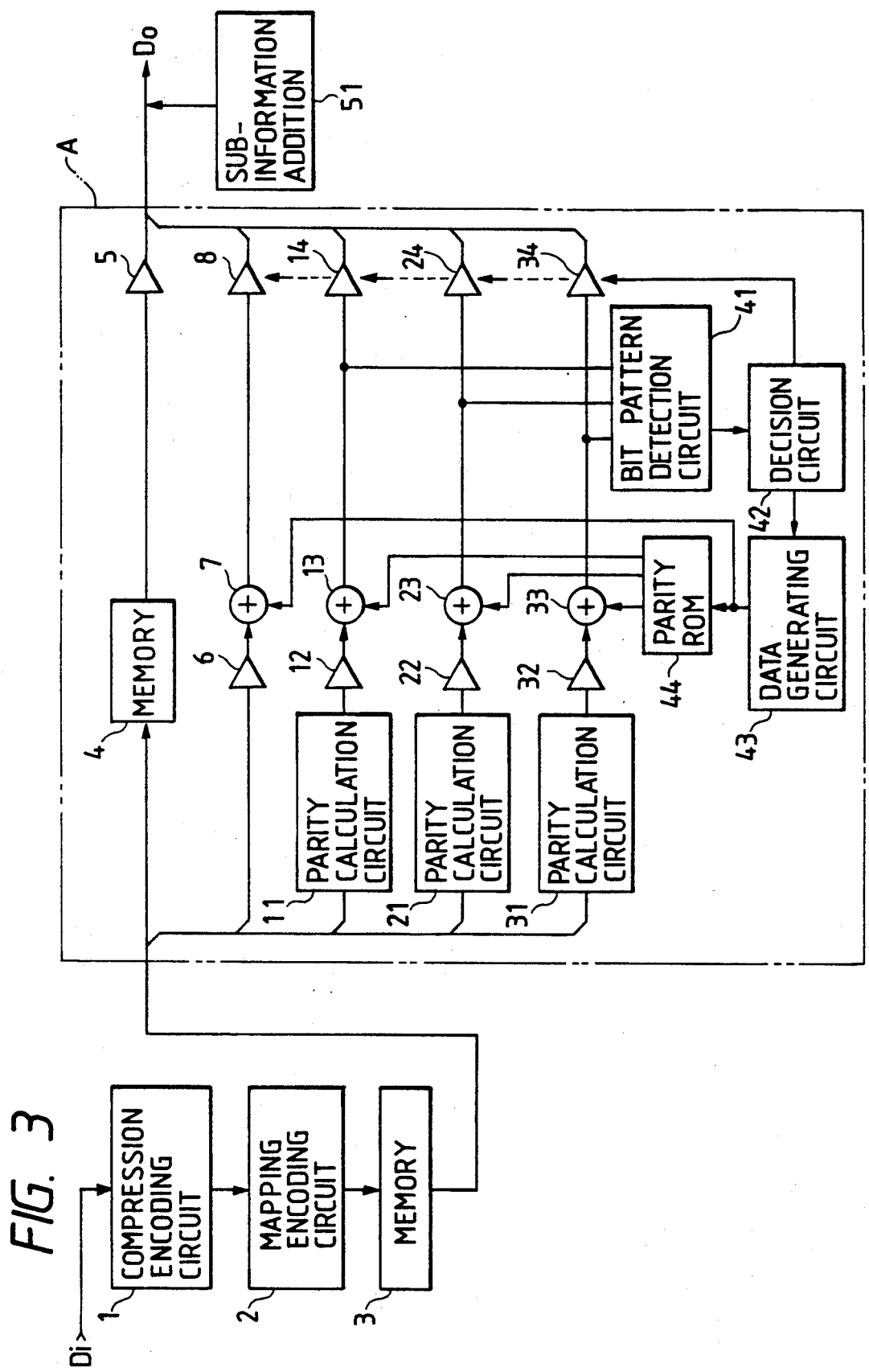
FIG. 3 is a block diagram showing a main part of a recording apparatus according to an embodiment of the present invention.

FIG. 3 is a block diagram showing a main part of a recording apparatus to which a code transmission system of the present invention is applied, and shows a section for generating a code string to be recorded.

In this embodiment, Reed-Solomon codes employing an irreducible polynomial on the Galois field ($2^8$) as a generating polynomial are assumed to be used as error check or correction codes, and an 8-bit code is processed as one symbol.

Figure 5:
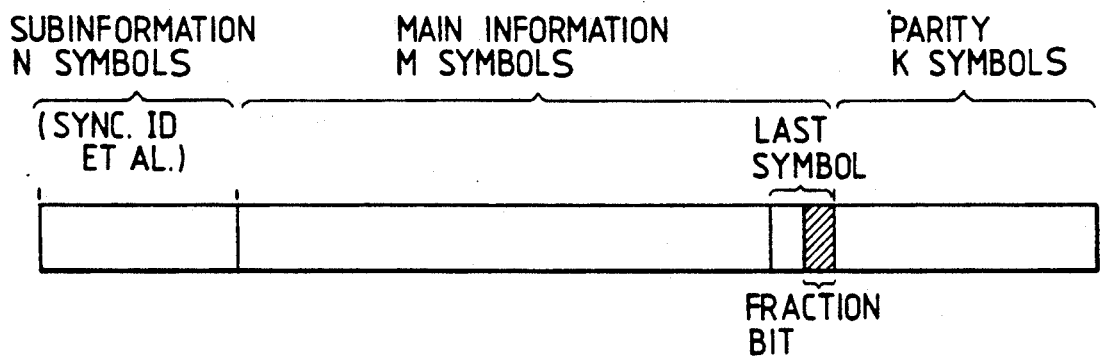
FIG. 5 shows an example of a data format of a code string to be transmitted by the arrangement shown in FIG. 3.

As a format of a code string to be recorded, a data frame format shown in FIG. 5 is assumed to be used. More specifically, as is apparent from FIG. 5, one data frame format consists of a main information code of M symbols to be transmitted, a subinformation code of N symbols, and parity bits corresponding to K symbols as error check or correction codes. The subinformation code includes a synchronizing code (Sync) and an IC code.

Each symbol consists of 8 bits. The last symbol of the M symbols of the main information code includes l fraction bits (where l is less than 8).

A process of generating fraction bits will be described below.

In general, image information or the like is sampled by 8 bits. In order to reduce an information volume, high-efficiency coding such as DPCM is normally performed to compress one pixel code to 4 bits. In an apparatus for compressing 8 bits to 4 bits and recording (transmitting) the compressed data, when information in one frame to which an error check or correction code is added corresponds to an odd number of times of sampling, the number of main information code bits in each data frame cannot be an integer multiple of 8 bits, and four fraction bits are generated.

In this case, when an error check or correction code using 8 bits as one symbol is used, a dummy code is substituted in the generated fraction bits. This embodiment positively utilizes a bit pattern substituted in this fraction bits so as to suppress low-frequency components of a generated parity.

In the following description, the fraction bits in FIG. 5 are assumed to be 4 bits.

In FIG. 3, an information code string Di to be recorded or transmitted is input to a compression encoding circuit 1. The circuit 1 executes processing for compressing an 8-bit code into a 4-bit code by high-efficiency coding such as the DPCM described above.

The compressed information code string is input to a mapping encoding circuit 2. The circuit 2 executes the above-mentioned mapping coding by utilizing the statistical nature of the compressed main information code string to convert it into a main information code string in which low-frequency components are suppressed without increasing redundancy, and to output the converted code string.

Figure 6:
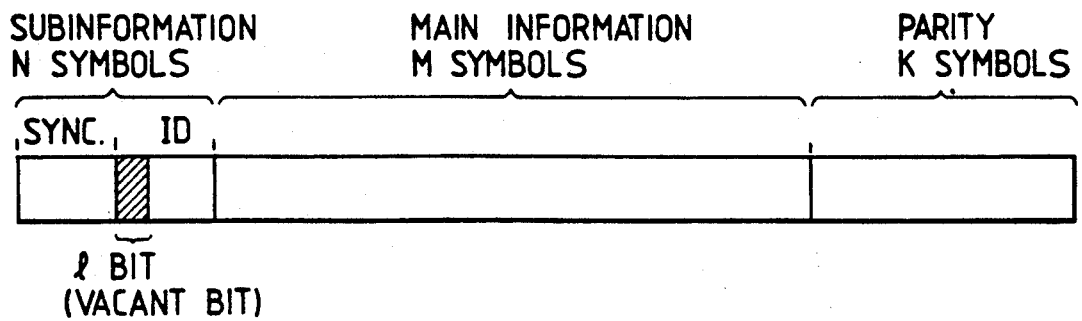
FIG. 6 shows another example of a data format of a code string to be transmitted by the arrangement shown in FIG. 3.

The converted main information code is input to a memory 3, and is sequentially read out according to a format shown in FIG. 6.

Note that a parity bit as an error check or correction code is generated by a parity calculation circuit (to be described later), and is substituted at a predetermined position in a data frame later. Codes of all "0"s as an initial setup value are substituted in fraction bits in the main information code string described above before parity calculation.

In a state wherein a predetermined initial setup value is substituted in fraction bits, subinformation and main information codes are supplied to parity calculation circuits 11, 21, and 31 for checking or correcting errors and a latch 6 and a memory 4 for latching a symbol including fraction bits.

A calculation for generating a parity will be explained below. A code for generating parity bits, i.e., the main information code of M symbols is expressed by a vector of information $\hat{i}=(i_1, i_2, i_3, \ldots, i_M)$, and an error check or correction code word is expressed by a vector $\hat{X}=(i_1, i_2, i_3, \ldots, i_M, x_i, x_2, \ldots, x_K)$. In this case, $x_1$ to $x_K$ correspond to parity bits. These vectors $\hat{x}$ and $\hat{i}$ can be expressed by $\hat{x}=\hat{i}G$ using a generating matrix G. In this case, the matrix G is as follows:

$$G = \begin{bmatrix} 1 & 0 & . & . & 0 & P_{1.1} & P_{2.1} & \ldots & P_{K.1} \\ 0 & 1 & & . & & P_{1.2} & & & . \\ . & . & & & & . & & & . \\ . & . & & & & & & & . \\ . & & . & 1 & 0 & . & & & . \\ 0 & . & . & 0 & 1 & P_{1.M} & \ldots & \ldots & P_{K.M} \end{bmatrix}$$

That is, parity bits are generated by multiplying information with a matrix.

Figure 4:
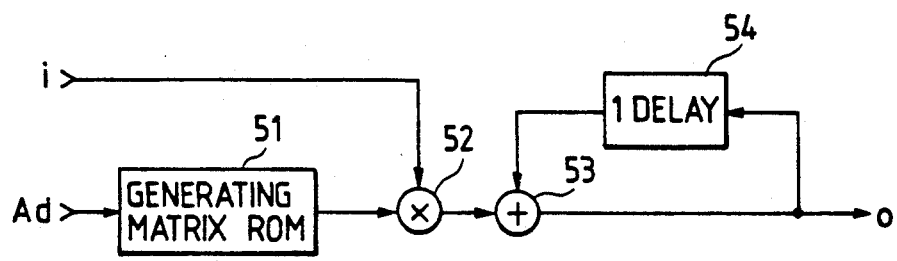
FIG. 4 is a diagram showing an arrangement of a parity calculation circuit shown in FIG. 3.

FIG. 4 is a diagram showing an arrangement of the parity calculation circuits 11, 21, and 31 shown in FIG. 3. A generating matrix ROM 51 stores coefficients $P_{1.1}$ to $P_{K.M}$ of the above-mentioned generating matrix at addresses corresponding to elements of the information î. A Galois field multiplier 52 multiplies each element of the information î with the corresponding output of the ROM 51, i.e., executes a Galois field multiplication of each coefficient of the generating matrix. The products are accumulated by a circuit constituted by a Galois field adder 53 and a one-symbol delay circuit 54, thus executing the above-mentioned matrix calculation. In this case, Galois fields are added by EXORing (exclusive ORing) bits.

Parities generated by the parity calculation circuits 11, 21, and 31 realized by the above arrangement are respectively latched by latches 12, 22, and 32. On the other hand, the memory 4 holds the main information code until parity generation is completed. The latch 6 holds only a symbol including fraction bits to generate a symbol including changed fraction bits when the fraction bits are changed.

The parities calculated as described above are input to a bit pattern detection circuit 41, and a bit pattern is detected. A decision circuit 42 decides based on the detected bit pattern whether or not low-frequency components of the calculated parities are sufficiently suppressed. More specifically, a DSV of a parity portion is calculated, and it can be decided if the absolute value of the calculated DSV is smaller than a predetermined threshold value.

When the absolute value is smaller than the threshold value, it can be determined that the low-frequency components of the generated parity code portion are sufficiently suppressed. Thus, the generated parities are latched by latches 14, 24, and 34 without changing the above-mentioned fraction bits, and are directly added to the information î. The obtained information is then output.

When the DSV is larger than the threshold value, it can be determined that the generated parity code portion has low-frequency components, and the parity code portion is not output and is held. A pulse signal is input to a counter in a data generating circuit 43 to increment a bit pattern substituted in the fraction bits, thereby sequentially updating the substituted value of the fraction bits. Parities are recalculated using the new bit pattern as new fraction bits, and the decision circuit 42 decides again if the bit pattern of the new parities has low-frequency components. The above operation is repeated until parities defining a pattern in which low-frequency components are suppressed are generated.

In this case, an adder 7 adds a value generated by the data generating circuit 43 and the latched symbol to correct a symbol including fraction bits. Of course, addition in this case is performed for a portion corresponding to fraction bits, and in practice, the above-mentioned correction is executed by adding Galois fields (EXORing of bits).

Parity correction can be realized as follows. Assume that the symbol including fraction bits is a jth symbol on the information î, i.e., $i_j$. During the parity calculations, a calculation of a term associated with $i_j$ can be re-started. More specifically, only multiplications between the coefficients $P_{1,j}, P_{2,j}, \ldots, P_{K,j}$ and the fraction bits of the information $i_j$ are executed, and the products can be respectively added to already calculated results when fraction bits are assumed to be all "0"s. Upon multiplications of the fraction bits of the information $i_j$, bits other than the value substituted in the information $i_j$ can be "0"s.

A parity ROM 44 shown in FIG. 3 receives an output value of the data generating circuit 43, and stores a result when the above-mentioned matrix calculation is performed in accordance with the received value. Therefore, the output from the parity ROM 44 is supplied to adders 13, 23, and 33 to be added to already calculated parities when fraction bits are all "0"s, thereby correcting parities. The recalculated parities are input to the bit pattern detection circuit 41 again, and the above-mentioned decision and correction operations are repeated to select optimal parities.

In this case, only when a pattern of parities with least low-frequency components is obtained, the parities are latched by the latches 14, 24, and 34, and at the same time, the symbol including the fraction bits which are changed by the substituted bit pattern is also latched by a latch 8. With this arrangement, the latches 14, 24, and 34 can finally latch parities defining an optimal pattern.

When the unused bits are, e.g., 4 bits, if all the bit patterns excluding 0000 are substituted, and calculations according to the substituted pattern are performed, only 15 calculations are required, and a pattern in which low-frequency components are most thoroughly suppressed can be selected from the obtained parities within a short period of time.

In this case, a pattern in which low-frequency components are most thoroughly suppressed need not be selected. For example, when parities having low-frequency components below a predetermined threshold value are obtained, the above-mentioned repetitive calculation processing may be interrupted, and parities at that time may be latched. In this case, a calculation time can be further shortened.

The decision method of a low-frequency component suppression state in the decision circuit 42 may also be realized by checking a CDS of each parity or the number of successive same levels (0 or 1), or by conditional decision as a combination of these methods.

The determined parities in which low-frequency components are suppressed and the symbol including changed fraction bits are respectively latched by the latches 8, 14, 24, and 34. The latched data are synthesized with other information $i_a$ (a=1, ..., M, excluding j) output at timings corresponding to the data format shown in FIG. 5, and the synthesized information is then output. A subinformation addition circuit 51 adds a synchronizing signal and an ID code for recording or transmission to the obtained information at a predetermined position, and outputs the obtained information.

Note that the memory 3 delays stored data by a time required for parity calculations.

With the above operations, an appropriate bit pattern can be substituted in the fraction bits to suppress low-frequency components of a parity portion.

In this embodiment, the number of parities is 3. However, the present invention is not limited to this. A dummy code may be separately prepared. Furthermore, the present invention can be applied to any error check or correction codes other than Reed-Solomon codes.

A case will be described below wherein a data frame format shown in FIG. 6 is assumed to be used as a format of a code string to be recorded. As can be seen from FIG. 6, one data frame format consists of a main information code of M symbols, a subinformation code of n bits (=N symbols) including unused l bits (l is less than 8), and parity bits of K symbols as error check or correction codes.

The subinformation code includes a synchronizing signal (Sync) and an ID code. In this case, the reason why l is less than 8 is that when codes are processed in units of symbols, the number of bits of an original subinformation code cannot be an integer multiple of 8, and the unused l bits are fraction bits. When the unused bits are used as a dummy code, low-frequency components of the entire code string can be suppressed without increasing redundancy of a code string using the arrangement shown in FIG. 3. More specifically, the predetermined number of bits of an ID code included in the subinformation code cannot be an integer multiple of 8 bits, and may often produce unused bits when a code is processed in units of symbols. This embodiment pays attention to the fraction bits which are not used at all so far, thereby suppressing low-frequency components of error check or correction codes.

More specifically, in the arrangement of FIG. 3, the bit pattern detection circuit 41 calculates a DSV of a parity portion. When the absolute value of the calculated DSV is larger than a predetermined threshold value, the decision circuit 42 detects this, and the data generating circuit 43 generates a new pattern of bits accordingly to update the unused bits. Parities are recalculated using the new bit pattern as the unused bits, and the decision circuit 42 decides again if the bit pattern of the new parities has low-frequency components. The above-mentioned operation is repeated until parities defining a pattern in which low-frequency components are suppressed can be generated.

The data generating circuit 43 can generate all the bit patterns of l bits. In this case, the data generating circuit 43 may sequentially generate all the l-bit patterns by using a simple counter, or may generate a pattern calculated in advance in accordance with the decision result of the decision circuit 42. In this embodiment, an initial setup value of unused bits is set to have a pattern of all "0"s. Thus, the patterns can be updated by adding Galois fields.

As described above, the format for updating a bit pattern of l unused bits in the ID code to decrease the DSV of parities can provide the same effect as in the case wherein a bit pattern of fraction bits is updated.

Figure 7:
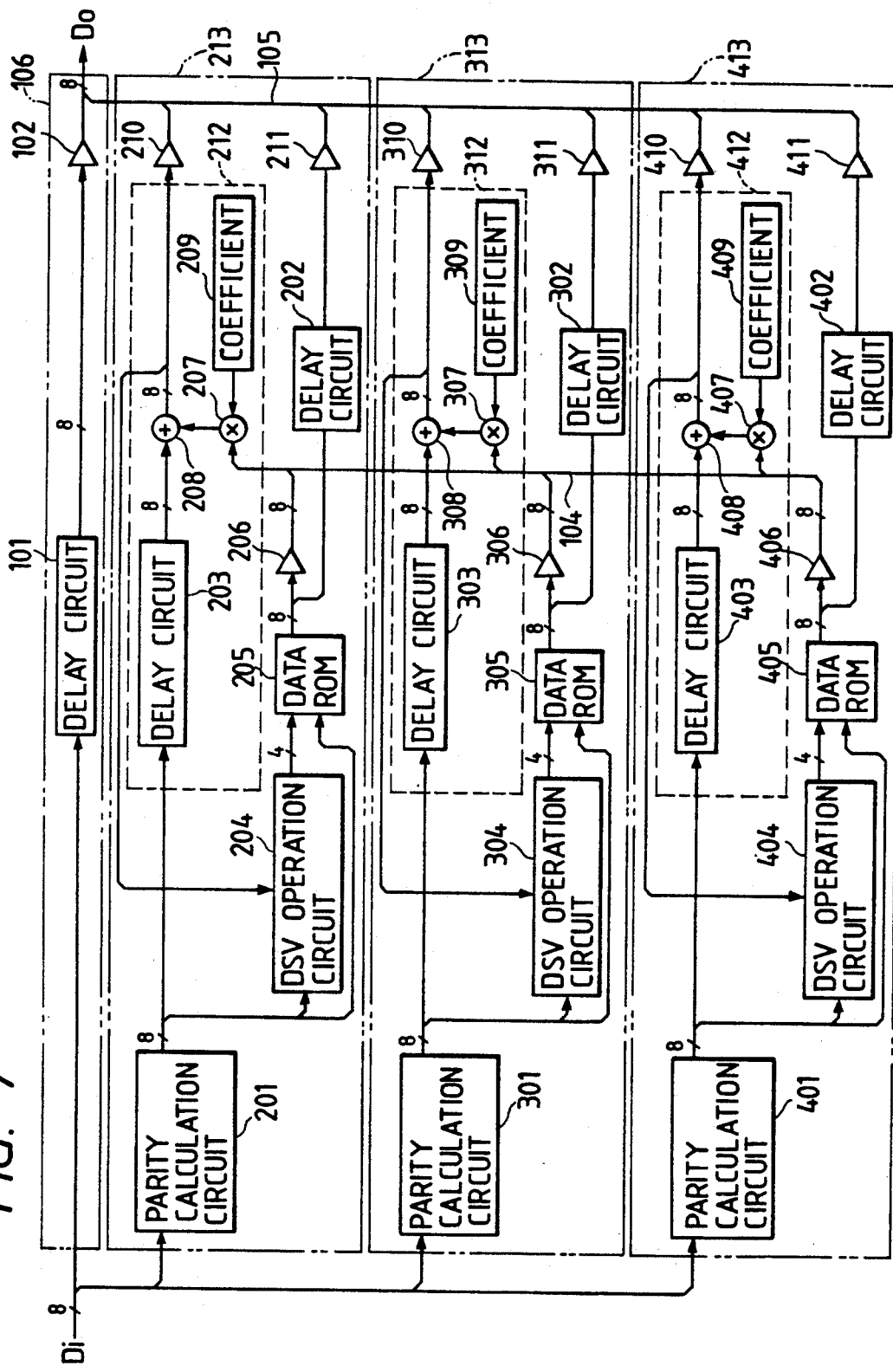
FIG. 7 is a block diagram showing an arrangement of an error check or correction code coding device according to another embodiment of the present invention.
Figure 8:
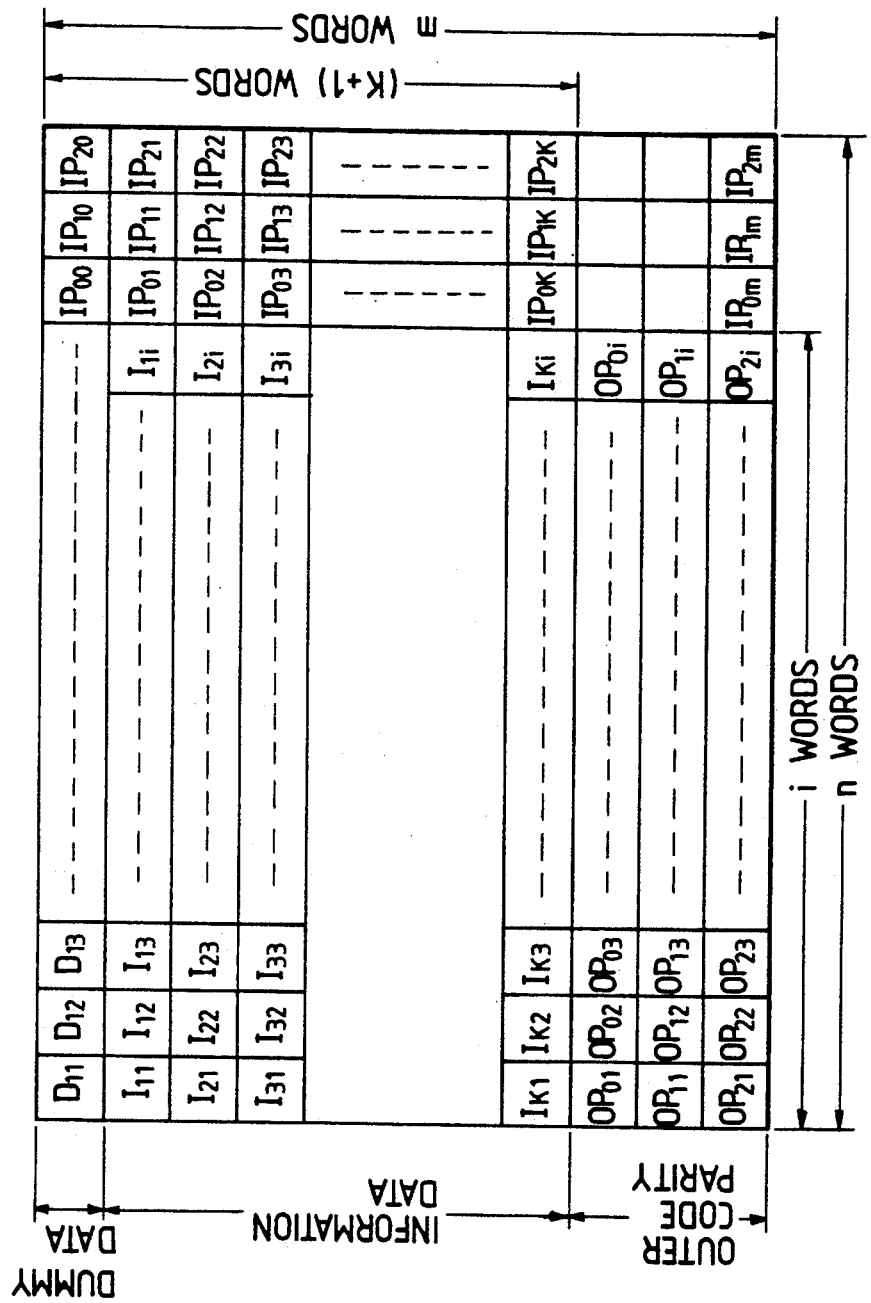
FIG. 8 shows an arrangement of a parity calculation circuit shown in FIG. 7.

FIG. 7 is a block diagram showing main part of still another embodiment of the present invention, and particularly shows a portion A in the apparatus shown in FIG. 3, i.e., an outer code generating section. FIG. 8 shows a data matrix of a code string recorded by the device of this embodiment.

In FIG. 8, $I_{ab}$ designates a main information code where a=1 to k, and b=1 to i. $Ib_{ab}$ designates an inner code parity where a=0 to 2 and b=0 to m. $OP_{ab}$ designates an outer code parity where a=0 to 2 and b=1 to i. Furthermore, $D_{ab}$ designates dummy data as a control code where a=1 and b=1 to i.

As shown in FIG. 8, in the data matrix, dummy data $D_{11}$ to $D_{1i}$ are arranged on the first line. As will be described later, values of outer code parities $OP_{01}$ to $OP_{2i}$ are operated by the dummy data. Inner and outer codes are respectively constituted by adding 3-word parities, thereby constituting product codes.

The circuit arrangement shown in FIG. 7 is roughly constituted by a circuit 106 for processing a main information code, and circuits 213, 313, and 413 for generating outer code parities $OP_{0b}$, $OP_{1b}$, and $OP_{2b}$. The circuits 213, 313, and 413 have the same circuit arrangement, except for internal coefficients of parity calculation circuits 201, 301, and 401, data ROMs 205, 305, and 405, and coefficient devices 209, 309, and 409.

Assume that low-frequency components of a main information code in an input code string Di are suppressed by a mapping encoding circuit (not shown). In addition, assume that all "0"s are substituted in dummy data in the code string Di. The code string Di is simultaneously input to a delay circuit 101 and the parity calculation circuits 201, 301, and 401.

The parity calculation circuits 201, 301, and 401 perform calculations in the vertical direction of the data matrix, and continuously output outer code parities of three lines after all the calculations of the outer code generating matrix are completed by the main information codes of k lines and the dummy data of one line in FIG. 8. Since the data ROMs 205, 305, and 405 are selectively operated, only the circuit 213 for generating the outer code parity $OP_{0b}$ for the 0th line will be described below for the following processing.

Parities generated by the parity calculation circuit 201 are input to a delay circuit 203 and a DSV (Digital Sum Value) operation circuit 204 in the order of $OP_{01}$, $OP_{02}$, ..., $OP_{0n}$. The DSV operation circuit 204 is not operated while the parity calculation circuit 201 is calculating parities, and starts operations simultaneously with input of the outer code parities $OP_{0b}$. The DSV operation circuit 204 decides the numbers of "0"s and "1"s in units of symbols (words), and calculates and holds their accumulation value. The circuit 204 outputs data serving as a reference for determining a CDS (Code word Digital Sum) of the next parity so as to cause the held accumulation value to approach 0. As this data, 4-bit data corresponding to one of nine different values, i.e., −8, −6, −4, −2, 0, 2, 4, 6, and 8 as a CDS value of the next parity is output according to the held DSV value, and serves as an address control signal of the data ROM 205.

The data ROM 205 receives 4 bits from the DSV operation circuit 204 as an upper address portion, and an 8-bit parity generated when dummy data="0"s as a lower address portion. The data ROM 205 stores values of data to be substituted as dummy data for changing a CDS of the present parity to one designated by the DSV operation circuit 204 in a table format. As data stored in the data ROM 205, values having large CDS are excluded since low-frequency components of dummy data themselves must be suppressed.

The dummy data output from the data ROM 205 is output onto an internal bus 104 used by the parity calculation circuits 213, 313, and 413, and is delayed by a delay circuit 202 to adjust its timing. The new dummy data is substituted in a dummy data portion of the code string Di, whose timing is adjusted by a delay circuit 101, on an output bus 105 through a buffer 211.

The dummy data output onto the internal bus 104 is multiplied with a coefficient from the coefficient device 209 by a multiplier 207. The product is added to a parity calculated assuming that dummy data="0"s by an adder 208, thus obtaining a parity having a desired CDS. The value of the parity having the desired CDS is fed back to the DSV operation circuit 204, and the held DSV value is corrected by the parity.

At this time, the dummy data is also supplied to multipliers 307 and 407, and parities according to this dummy data are also output from adders 308 and 408. The parities output from these adders 308 and 408 are fed back to DSV operation circuits 304 and 404, and held DSV values are corrected accordingly.

With the above-mentioned processing, $OP_{01}$, $OP_{11}$, and $OP_{21}$ are obtained, and when $OP_{01}$ has a desired CDS value, the data ROM 305 is then set in a read enable state to correct $OP_{12}$ to have a desired CDS value.

In this embodiment, with the series of operations described above, parities are corrected to have desired CDS values in the order of $OP_{01}$, $OP_{12}$, $OP_{23}$, $OP_{04}$, $OP_{15}$, ... in the outer code parities shown in FIG. 8. Thus, DSVs can be controlled in units of three words in the transmission direction of codes (line direction). Thus, a code string in which low-frequency components are sufficiently suppressed in all the three data frames in which parity words successively appear can be output from the outer code parity generating section. Thereafter, the inner code parities $IP_{ab}$ are added to the code string by a circuit (not shown), and the obtained code string is supplied to the next recording system circuit.

With the above arrangement, all the three data frames consisting of only parities can be recorded as a code string in which low-frequency components are suppressed, and errors in a recording/reproduction system can be greatly reduced. Each parity can be determined by only one calculation, and this operation can be realized by a relatively simple circuit arrangement. In addition, high-speed processing can also be achieved.

Note that inner code parities added in the next circuit are successively recorded in three words. However, these inner code parities can be easily scattered in lines by the technique disclosed in U.S. Pat. No. 4,779,276 described above, and no problem is posed.

Still another embodiment of the present invention will be described below with reference to FIG. 9.

Figure 9:
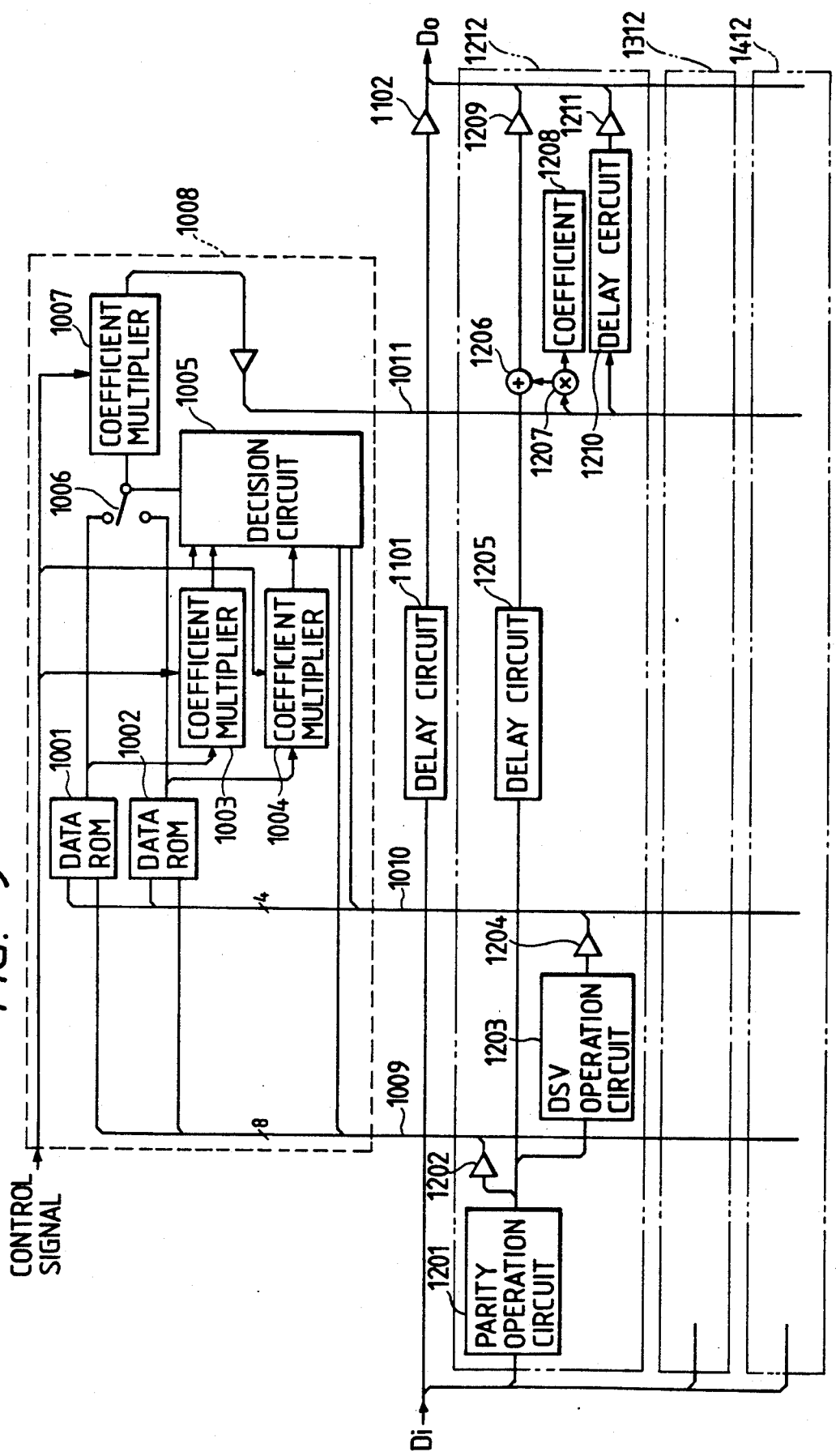
FIG. 9 is a block diagram showing an arrangement of an error check or correction code coding device according to still another embodiment of the present invention.

FIG. 9 also shows an arrangement of only an outer code generating section for recording a code string represented by the data matrix of FIG. 8.

The section shown in FIG. 9 includes a circuit 1212 for generating outer code parities $OP_{0b}$, a circuit for generating outer code parities $OP_{1b}$, and a circuit 1412 for generating outer code parities $OP_{2b}$. These circuits have the same circuit arrangements, and FIG. 9 discloses an internal arrangement of only the circuit 1212. These parity generating circuits 1212, 1312, and 1412 have a common dummy data generating unit 1008 unlike the parity generating circuits 213, 313, and 413.

The circuits 1212, 1312, and 1412 perform calculations of parities and DSVs as in the embodiment shown in FIG. 7. In the circuit 1212, for example, parities are calculated by a parity operation circuit 1201, and a DSV is calculated by a DSV operation circuit 1203. Data from these circuits 1212, 1312, and are supplied to the common dummy data generating unit 1008 through a parity bus 1009 for the parity data and through a control bus 1010 for data associated with a desired CDS value.

The parity and CDS designation data calculated by the circuit 1212 are supplied to data ROMs 1001 and 1002 respectively through the buses 1009 and 1010 as upper address portions. The data ROMs 1001 and 1002 respectively have data to be substituted in a dummy line as tables so as to generate parities having a CDS necessary for converging the DSV in a parity successive portion in $OP_{0b}$ to 0.

The data ROMs 1001 and 1002 output dummy data for generating parities having the same CDS value but different values. The output values are products obtained by multiplying data with coefficients in the generating matrix so that parities can utilize the common table.

The two dummy data output from the data ROMs 1001 and 1002 are input to coefficient devices 1003 and 1004, and undergo divisions with coefficients of the generating matrix of the parities $OP_{0b}$ selected by a control signal (to be described later). Thus, the quotients are supplied to a decision circuit 1005 in the form of data to be substituted as dummy data. At this time, data are output from the circuit 1312 for generating the parities $OP_{1b}$, and are simultaneously supplied to the decision circuit 1005.

In the decision circuit 1005, the input two dummy data are multiplied with coefficients of the generating matrix of the parities $OP_{1b}$, and are added to parities from the circuit 1312 for generating the parities $OP_{1b}$, thereby generating two different parities $OP_{1b}$ to be substituted. Furthermore, the decision circuit 1005 obtains CDSs for the two different parities, and controls a switching circuit 1006 to select dummy data which can generate parities having a higher suppression effect of low-frequency components for the parities $OP_{1b}$ with reference to the DSV value of the input parities $OP_{1b}$.

Thereafter, the dummy data are subjected to divisions with coefficients of the generating matrix of the parities $OP_{0b}$ by a coefficient device 107 as in the above embodiment, and the obtained data are output onto an internal bus 1011 as in the embodiment shown in FIG. 7. The following operations are the same as those in the embodiment shown in FIG. 7 described above, and substitution of dummy data and updating of parities are sequentially executed. As a result, parities with reduced low-frequency components can be output from the outer code generating section.

Although the detailed arrangement of the decision circuit 1005 is not particularly disclosed, it can be easily constituted based on the arrangement of the parity generating circuits shown in FIGS. 7 and 9.

The control signal is data indicating the present parity string whose DSV is to be reduced of the parities $OP_{0b}$, $OP_{1b}$, and $OP_{2b}$, and can be easily obtained in synchronism with an input timing of the code string Di. More specifically, the above-mentioned processing is associated with a process for performing DSV control of a parity string with reference to data output from the circuit 1212 for the parities $OP_{0b}$. At the next timing, processing is executed on the basis of data from the circuit 1312 for the parities $OP_{1b}$, and the decision circuit 1005 switches the switching circuit 1006 to decrease the DSV of the parity string $OP_{2b}$ as much as possible. Similarly, at the still next timing, processing is executed on the basis of data from the circuit 1412 for the parities $OP_{2b}$, and the decision circuit 1005 switches the switching circuit 1006 to decrease the DSV of the parity string $OP_{0b}$ as much as possible. In this manner, the above-mentioned process is repeated.

According to the arrangement shown in FIG. 9, DSV control of parities can be more frequently performed as compared to the arrangement shown in FIG. 7, so that low-frequency components in a portion where parities successively appear can be more effectively suppressed. According to this embodiment, two different dummy data are generated, and one of these data is selected. The number of kinds of dummy data is increased to further improve the low-frequency component suppression effect. As can be seen from the above description, it is possible to more effectively suppress low-frequency components by obtaining DSVs from more parity strings, which serve as references for this selection.

Figure 10:
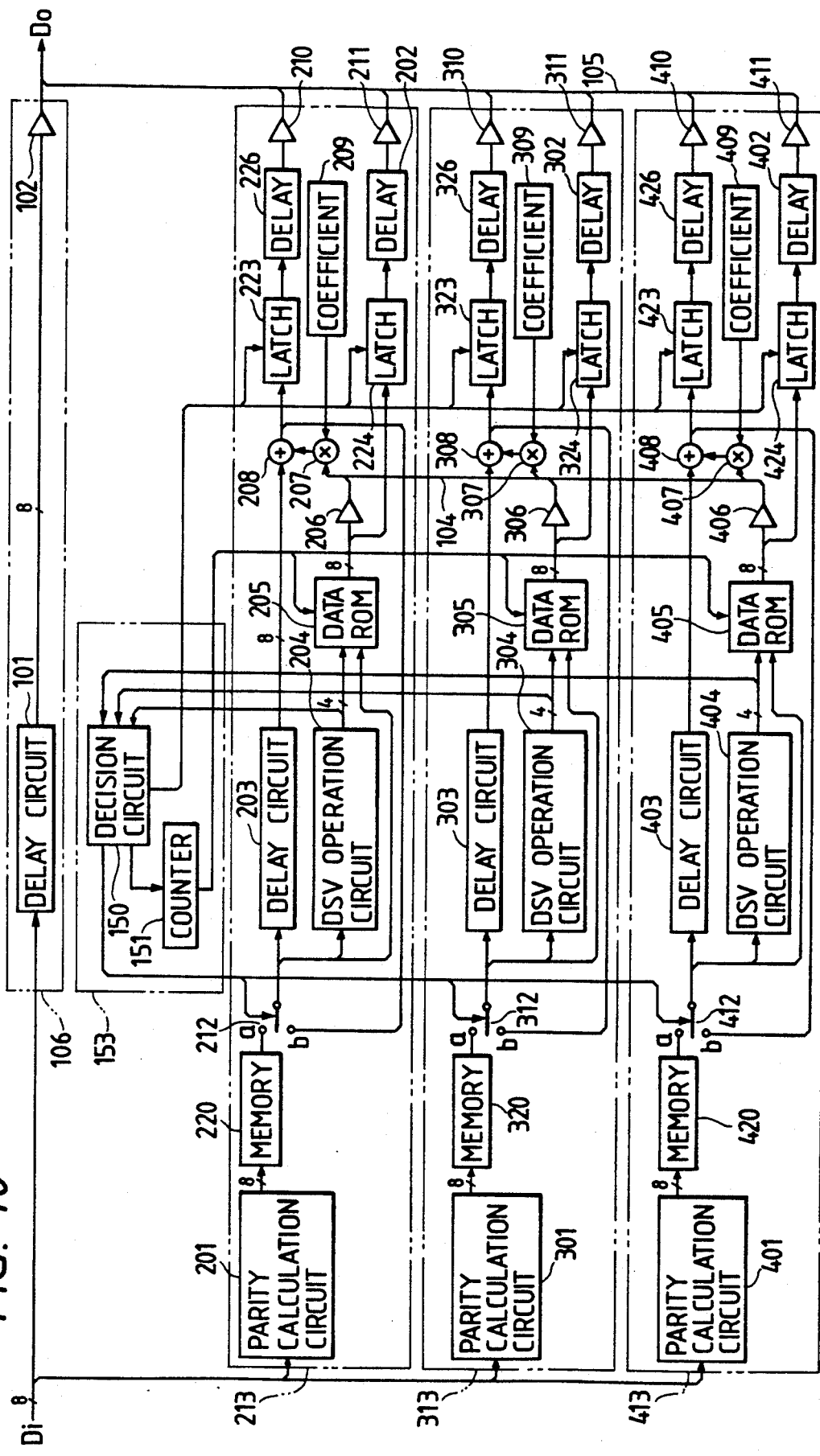
FIG. 10 is a block diagram showing an arrangement of an error check or correction code coding device according to still another embodiment of the present invention.

FIG. 10 is a block diagram showing an arrangement of an outer code generating circuit according to still another embodiment of the present invention. The same reference numerals in FIG. 10 denote the same parts as in FIG. 7, and a detailed description thereof will be omitted.

Parities are written in memories 220, 320, and 420 in the order of $OP_{a1}$, $OP_{a2}$, ..., $OP_{an}$, and upon completion of write access of $OP_{an}$, $OP_{01}$, $OP_{11}$, and $OP_{21}$ are output from the memories 220, 320, and 420.

When the parities are read out from the memories 220, 320, and 420, a decision circuit 150 (to be described later) connects switches 212, 312, and 412 to their terminals a, and the parities $OP_{01}$, $OP_{11}$, and $OP_{21}$ are input to delay circuits 203, 303, and 403, and DSV (Digital Sum Value) operation circuits 204, 304, and 404, respectively. The DSV operation circuits 204, 304, and 404 are not operated when parity calculation circuits 201, 301, and 401 calculate parities, and start their operations upon reception of the outer code parities $OP_{0b}$, $OP_{1b}$, and $OP_{2b}$.

The DSV operation circuits 204, 304, and 404 decide the numbers of "0"s and "1"s in units of symbols (words), and calculate and hold their accumulation values. The circuits 204, 304, and 404 output data each serving as a reference for determining a CDS (Code word Digital Sum) of the next parity so as to cause the held accumulation value to approach 0. As this data, 4-bit data corresponding to one of nine different values, i.e., $-8$, $-6$, $-4$, $-2$, 0, 2, 4, 6, and 8 as a CDS value of the next parity is output according to the held DSV value, and serves as an address control signal of each of data ROMs 205, 305, and 405.

The data ROMs 205, 305, and 405 receive an output from a counter 151 (to be described later) as an upper address portion, four-bit data from the DSV operation circuits 204, 304, and 404 as a middle address portion, and 8-bit parities from the switches 212, 312, and 412 as a lower address portion.

The data ROMs 205, 305, and 405 are selectively set in a read enable state. When the parities $OP_{01}$, $OP_{11}$, and $OP_{12}$ are output from the memories 220, 320, and 420, the data ROM 205 is assumed to be set in a read enable state. The data ROMs 205, 305, and 405 store values of data to be substituted as dummy data for changing CDSs of parities input to their lower address portions to desired CDSs in a table format. Note that there are a plurality of dummy data for correcting a certain parity to have a desired CDS value. In this embodiment, only dummy data having CDS values equal to or lower than a predetermined value are stored, and are assigned to upper bit address portions corresponding to the output from the counter 151.

The dummy data output from the data ROM 205 are output onto an internal bus 104 used by parity generating circuits 213, 313, and 413.

The dummy data output onto the internal bus 104 are multiplied with coefficients from coefficient devices 209, 309, and 409 by multipliers 207, 307, and 407, respectively. The products are added to parities which are generated to have dummy data = "0"s and output from the delay circuits 203, 303, and 403 by adders 208, 308, and 408. As a result, the adders 208, 308, and 408 can output parities each having a desired CDS. The parities and dummy data at this time are held by latches 223, 323, and 423, and a latch 224 in response to a latch pulse signal from the decision circuit 150 (to be described later).

At this timing, the decision circuit 150 connects the switches 212, 312, and 412 to their terminals b, and new parities output from the adders 208, 308, and 408 are output from the switches 212, 312, and 412. The DSV operation circuits 204, 304, and 404 correct output data corresponding to the desired CDS value in accordance with the new parities.

The output data from the DSV operation circuits 204, 304, and 404 are supplied to the decision circuit 150. The decision circuit 150 decides if all the absolute values of the DSV values of these three data are equal to or smaller than a predetermined value. If the data ROM 205 is in the read enable state, since the output from the DSV operation circuit 204 should be 0, it is essentially checked if the absolute values of the output data from the DSV operation circuits 304 and 404 are equal to or smaller than the predetermined value. If all these absolute values are equal to or smaller than the predetermined value, the decision circuit 150 outputs a latch pulse signal, so that the dummy data output from the data ROM 205 and parities output from the adders 208, 308, and 408 at this time are latched.

If at least one of the absolute values of the three output data from the DSV operation circuits 204, 304, and 404 is larger than the predetermined value, the decision circuit 150 outputs a pulse signal to be counted to the counter 151. If the maximum absolute value of the three output data is smaller than the maximum absolute value of the output data upon calculation of parities already latched by the latches 223, 323, and 423, the decision circuit 150 outputs a latch pulse signal.

When the counter 151 counts up, the upper address of the data ROM 205 is changed. Thus, the data ROM 205 outputs another dummy data in which the CDS value of the parity output from the adder 208 is left unchanged. Thus, the CDS values of the parities output from the remaining adders 308 and 408 are changed accordingly, and the obtained three new parities are input again to the DSV operation circuits 204, 304, and 404 through the switches 212, 312, and 412.

Upon repetition of this operation, parities and dummy data in which DSVs in the three parity lines are equal to or smaller than the predetermined value can be latched. When the absolute values of the three output data cannot be equal to or smaller than the predetermined value after the predetermined number of times of repetitive processing, the repetitive processing is interrupted. In this case, the parities and dummy data when the maximum absolute value of the three output data becomes minimum are latched.

Thereafter, the three parities latched by the latches 223, 323, and 423 are output from the corresponding outer code parity generating sections through delay circuits 226, 326, and 426, and buffers 210, 310, and 410, respectively. The dummy data latched by the latch 224 is output through a delay circuit 202 and a buffer 211. These parities and dummy data are respectively substituted in parity and dummy data portions of an output code string $D_o$ on an output bus 105. Thereafter, the inner code parities $IP_{ab}$ are added to the code string by a circuit (not shown), and the obtained code string is supplied to the next recording system circuit.

The decision circuit 150 connects the switches 212, 312, and 412 to the terminals a, and the next parity strings $OP_{02}$, $OP_{12}$, and $OP_{22}$ are input to the DSV operation circuits 204, 304, and 404 to start the same operation described above. In this case, the data ROM 305 is set in a read enable state. Thereafter, every time new parities are input from the memories 220, 320, and 420, the data ROMs to be set in the read enable state are circularly switched, thereby repeating the same operation.

With the above arrangement, all the three data frames consisting of only parities can be recorded as a code string in which low-frequency components are suppressed, and errors in a recording/reproduction system can be greatly reduced. Since low-frequency components are not increased even instantaneously, a probability of a temporary code error can be greatly reduced.

In the above embodiment, one of the data ROMs 205, 305, and 405 is used to calculate a parity string. When the outputs from the DSV operation circuits 204, 304, and 404 cannot be equal to or smaller than the predetermined value after the decision circuit 150 performs a predetermined number of times of decision, the data ROM to be set in the read enable state can be switched to obtain optimal dummy data which can further reduce the DSV as a whole.

In the repetitive processing, a ROM or the like may be used to look up tables, so that a processing time can be shortened. It is then possible to perform several repetitive processing operations within a parity calculation time.

What is claimed is:

1. An error detection or error correction code coding device comprising:
   (a) calculation means for calculating a redundancy code for detecting or correcting an error from a code group including main information codes and a control code having no correlation with the main information codes; and
   (b) selection means for selecting a pattern of the control code from a plurality of patterns, said selection means selecting a pattern which can reduce a DC component of the redundancy code as much as possible.

2. A device according to claim 1, wherein said calculation means handles codes in units of a word consisting of a predetermined number of bits, and the control code constitutes odd word together with the main information code, a number of bits of which is sampler than the predetermined number of bits.

3. A device according to claim 2, wherein the main information codes and control code consist of word groups which include a word group containing a number n (n is an integer not less than 2) of compression codes and a word group containing the control code and a number m (m is an integer less than n) of compression codes, and each of the compression codes is obtained by compressing a sampled value of an information signal.

4. A device according to claim 1, wherein the code group further includes subinformation codes indicating other information associated with the main information codes, said calculation means handles codes in units of a word consisting of a predetermined number of bits, and the word containing the control code includes any of the subinformation codes, a number of bits of which is smaller than the predetermined number of bits, and the control code.

5. A device according to claim 1, further comprising:
   mapping encoding means for mapping-encoding an information signal to suppress a low-frequency component of the information signal, and outputting the main information codes.

6. A device according to claim 1, further comprising:
   detection means for detecting a low-frequency component of the redundancy code, and controlling said selection means.

7. A device according to claim 6, wherein said detection means includes DSV (Digital Sum Value) calculation means for calculating a DSV for a plurality of the redundancy codes.

8. A device according to claim 7, wherein said selection means includes memory means for storing a plurality of patterns of the control code, and outputting one of the plurality of patterns from an address in accordance with an output from said DSV calculation means.

9. A device according to claim 8, wherein said memory means receives the output from said DSV calculation means and the redundancy code as an address, and outputs the control code having a pattern corresponding to another redundancy code for canceling the DSV calculated by said DSV calculation means.

10. A device according to claim 6, wherein said selection means includes a data generating circuit which can generate the plurality of patterns of the control codes, and changes a pattern to be generated in accordance with an output from said detection means.

11. A device according to claim 10, wherein said selection means includes a counter for performing a count up operation in accordance with the output from said detection means, and uses an output from said counter for selecting the control code.

12. An error detection or error correction code coding device comprising:
   (a) calculation means for calculating a redundancy code for detecting or correcting an error from a code group including main information codes and a control code having no correlation with the main information codes;
   (b) detection means for detecting a low-frequency component of the redundancy code; and
   (c) determination means for determining a pattern of the control code in accordance with an output from said detection means.

13. A device according to claim 12, wherein said detection means includes DSV (Digital Sum Value) calculation means for calculating a DSV for a plurality of the redundancy codes, and
   said determination means includes memory means for storing a plurality of patterns of the control code, and outputting one of the plurality of patterns from an address in accordance with an output from said DSV calculation means.

14. A device according to claim 12, wherein said determination means includes a counter for performing a count up operation in accordance with the output from said detection means, and uses an output from said counter for determining the control code.

15. A device according to claim 12, wherein said calculation means calculates a plurality of words of the redundancy codes for detecting or correcting an error in accordance with the code group, and
said detection means includes a plurality of detection circuits for detecting a low-frequency components of the plurality of words of redundancy codes.

16. A device according to claim 15, wherein said determination means includes a code generating circuit for generating a plurality of code patterns in accordance with an output from one of said plurality of detection circuits, and a selection circuit for selecting one of the plurality of code patterns in accordance with an output from another one of said plurality of detection circuits.

17. A device according to claim 15, wherein said determination means determines the pattern of the control code by circularly using outputs of said plurality of detection circuits.

18. An error detection or error correction code coding device comprising:
    (a) calculation means for calculating a redundancy code for detecting or correcting an error from a code group including main information codes and control code having no correlation with the main information codes;
    (b) transmission means for transmitting a code sequence in units of data frames each obtained by adding the redundancy code to the code group;
    (c) detection means for detecting a low-frequency component of a code previously transmitted by said transmission means; and
    (d) determination means for determining a pattern of the control code in accordance with an output from said detection means.

19. A device according to claim 18, wherein said determination means includes a counter for performing a count up operation in accordance with the output from said detection means, and uses an output from said counter for determining a pattern of the control code.

20. A device according to claim 18, wherein said detection means includes DSV (Digital Sum Value) calculation means for calculating a DSV of the previously transmitted redundancy code.

21. A device according to claim 20, wherein said determination means includes memory means for storing a plurality of patterns of the control code, and outputting one of the plurality of patterns from an address in accordance with an output from said DSV calculation means.

22. A device according to claim 21, wherein said memory means outputs the pattern of the control code from an address according to an output from said DSV calculation means and the redundancy code, and a pattern of the redundancy code is changed in accordance with the pattern of the control code output from said memory means.

23. A device according to claim 20, wherein each of the data frames includes a plurality of words of redundancy codes, and said DSV calculation means includes a plurality of DSV calculation circuits for calculating the DSVs for the plurality of words of redundancy codes.

24. A device according to claim 23, wherein said determination means determines the pattern of the control code by circularly using outputs of said plurality of DSV calculation circuits.

25. A device according to claim 23, wherein said determination means includes a code generating circuit for generating a plurality of code patterns in accordance with an output from one of said plurality of DSV calculation circuits, and a selection circuit for selecting one of the plurality of code patterns in accordance with the output from another one of said plurality of DSV calculation circuits.

26. A device according to claim 25, wherein said code generating circuit and said selection circuit are operated by circularly using outputs of said plurality of DSV calculation circuits, and use outputs of different ones of said plurality of DSV calculation circuits.

* * * * *

UNITED STATES PATENT AND TRADEMARK OFFICE
CERTIFICATE OF CORRECTION

PATENT NO. : 5,212,695

DATED : May 18, 1993

INVENTOR(S) : AKIHIRO SHIKAKURA ET AL.　　　Page 1 of 2

It is certified that error appears in the above-identified patent and that said Letters Patent is hereby corrected as shown below: Title Page:

AT [54] TITLE

"ERRO" should read --ERROR--.

AT [56] REFERENCES CITED

U.S. Patent Documents,
　　　"Kashide et al." should read --Kashida et al.--.

COLUMN 1

Line 2, "ERRO" should read --ERROR--.
　　　Line 46, "which" should read --high--.

COLUMN 2

Line 2, "the result, a" should read --a result, the--.
　　　Line 4, "respect" should read --aspect--.
　　　Line 11, "code," should read --code-- and
　　　　　　　 "code" should read --code,--.

COLUMN 4

Line 65, "vector X" should read --vector x--.

COLUMN 9

Line 55, "circuit" should read --circuit 1312--.
　　　Line 68, "and are" should read --and 1412 are--.

UNITED STATES PATENT AND TRADEMARK OFFICE
CERTIFICATE OF CORRECTION

PATENT NO. : 5,212,695
DATED : May 18, 1993
INVENTOR(S) : AKIHIRO SHIKAKURA ET AL.    Page 2 of 2

It is certified that error appears in the above-identified patent and that said Letters Patent is hereby corrected as shown below:

COLUMN 13

Line 60, "odd" should read --an odd--.
    Line 61, sampler" should read --smaller--.

COLUMN 15

Line 5, "determining the" should read
          --determining a pattern of the--.
    Line 11, "a" should be deleted.
    Line 29, "control" should read --a control--.

Signed and Sealed this

Twenty-second Day of February, 1994

Attest:

BRUCE LEHMAN

*Attesting Officer*    *Commissioner of Patents and Trademarks*